United States Patent
Kuo (10) Patent No.: US 8,312,205 B2
(45) Date of Patent: Nov. 13, 2012

(54) METHOD FOR IDENTIFYING A PAGE OF A BLOCK OF FLASH MEMORY, AND ASSOCIATED MEMORY DEVICE

(75) Inventor: Wu-Chi Kuo, Kaohsiung (TW)

(73) Assignees: Silicon Motion Inc., keji Chuangyeyuan, Tianan Digital, Futian, Shenzhen, Guangdong (CN); Silicon Motion Inc., Jhubei, Hsinchu County (TW)

( * ) Notice: Subject to any disclaimer, the term of this patent is extended or adjusted under 35 U.S.C. 154(b) by 352 days.

(21) Appl. No.: 12/756,165

(22) Filed: Apr. 7, 2010

(65) Prior Publication Data

US 2011/0040928 A1    Feb. 17, 2011

(30) Foreign Application Priority Data

Aug. 13, 2009  (TW) .............................. 98127246 A (51) Int. Cl.
*G06F 5/08* (2006.01)
(52) U.S. Cl. .................. 711/103; 711/E12.008
(58) Field of Classification Search .................. 711/103, 711/E12.008, E12.009
See application file for complete search history.

(56) References Cited

U.S. PATENT DOCUMENTS

| 2004/0024956 | A1* | 2/2004 | Muramatsu | 711/103 |
| 2004/0151055 | A1* | 8/2004 | Shieh | 365/238.5 |
| 2006/0031627 | A1* | 2/2006 | Conley | 711/103 |
| 2007/0097750 | A1* | 5/2007 | Shiga et al. | 365/185.22 |
| 2007/0276988 | A1* | 11/2007 | Luo et al. | 711/103 |
| 2009/0228634 | A1* | 9/2009 | Nakamura et al. | 711/103 |
| 2010/0037000 | A1* | 2/2010 | Kaabouch et al. | 711/103 |
| 2010/0174850 | A1* | 7/2010 | Chu et al. | 711/103 |
| 2010/0299494 | A1* | 11/2010 | Van Acht et al. | 711/166 |
| 2011/0072189 | A1* | 3/2011 | Post et al. | 711/103 |

FOREIGN PATENT DOCUMENTS

CN                1518000 A        8/2004

* cited by examiner

*Primary Examiner* — Hal Schnee
(74) *Attorney, Agent, or Firm* — Winston Hsu; Scott Margo (57) ABSTRACT

A memory device includes a flash memory and a controller. The flash memory includes a plurality of blocks, and each block includes a plurality of pages. The controller is utilized for reading a plurality of bits from an identification region of a page, and determining whether the page is blank or not according to the plurality of bits.

15 Claims, 8 Drawing Sheets

| Byte_0 | Byte_1 | Byte_2 | Byte_3 | Byte_4 |

METHOD FOR IDENTIFYING A PAGE OF A BLOCK OF FLASH MEMORY, AND ASSOCIATED MEMORY DEVICE

BACKGROUND OF THE INVENTION

1. Field of the Invention

The present invention relates to a flash memory, and more particularly, to a method for identifying a page of a block of a flash memory and determining whether the page is blank or not, and to an associated memory device thereof.

2. Description of the Prior Art

As flash memory technology progresses, many kinds of portable memory devices, such as memory cards respectively complying with SD/MMC, CF, MS, and XD standards, can be widely implemented in various applications. Therefore, the control of access to flash memories in these portable memory devices has become an important issue.

When data is copied from a first block to a second block of the flash memory, a controller of the flash memory sequentially reads the contents of all the pages in the first block and determines which page(s) is blank. Then, the controller does not copy the contents of the blank page(s) to the second block. In other words, for each page of the first block, the controller needs to read all the bits of the page, and only then can determine whether the page is blank or not. Therefore, the efficiency of accessing the flash memory is decreased. In particular, when most pages of the first block are blank pages, the efficiency of the flash memory will be seriously degraded.

SUMMARY OF THE INVENTION

It is therefore an objective of the present invention to provide a method for identifying a page of a block of a flash memory and determining whether the page is blank or not, and to an associated memory device thereof.

According to one embodiment of the present invention, a method for identifying a page of a block of a flash memory comprises: reading a plurality of bits from an identification region of the page; and determining whether the page is blank or not according to the plurality of bits.

According to another embodiment of the present invention, a memory device includes a flash memory and a controller. The flash memory includes a plurality of blocks, and each block includes a plurality of pages. The controller is utilized for reading a plurality of bits from an identification region of a page, and determining whether the page is blank or not according to the plurality of bits.

According to another embodiment of the present invention, a method for identifying a page of a block of a flash memory comprises: reading an identification bit of the page; and determining whether the page is blank or not according to the identification bit.

According to another embodiment of the present invention, a memory device includes a flash memory and a controller. The flash memory includes a plurality of blocks, and each block includes a plurality of pages. The controller is utilized for reading an identification bit of the page, and determining whether the page is blank or not according to the identification bit.

According to a method for identifying a page of a block of a flash memory and determining whether the page is blank or not, and to an associated memory device thereof of the present invention, the controller can identify whether a page is blank or not by reading only one bit or a few bits of the page. Therefore, the efficiency of accessing the flash memory is greatly improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
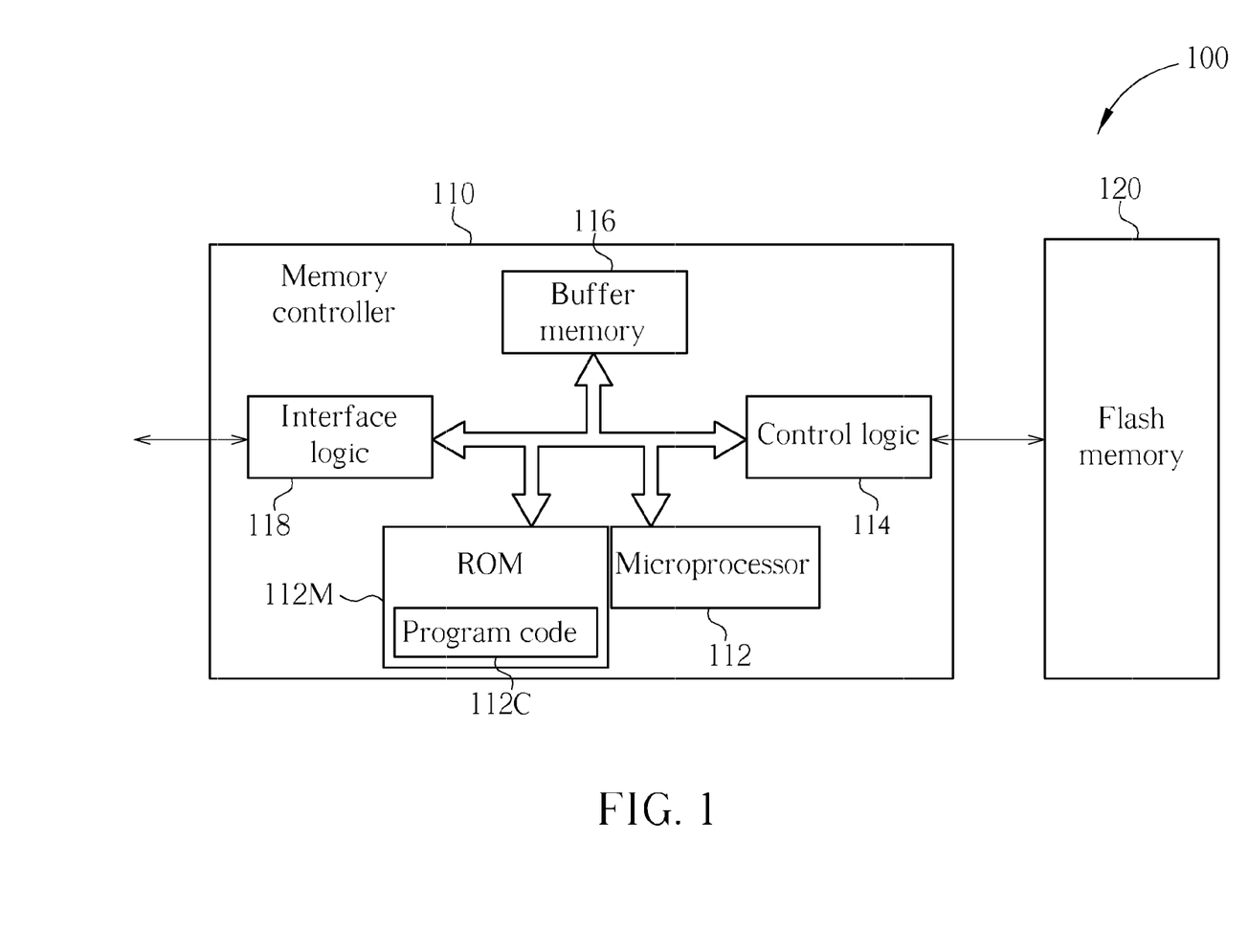
FIG. 1 is a memory device according to one embodiment of the present invention.

Please refer to FIG. 1. FIG. 1 is a memory device 100 according to one embodiment of the present invention. The memory device 100 of this embodiment is a portable memory device, such as a memory card complying with SD/MMC, CF, MS, or XD standards. The memory device 100 comprises a flash memory 120, and further comprises a controller arranged to access the flash memory 120, where the aforementioned controller of this embodiment is a memory controller 110. According to this embodiment, the memory controller 110 comprises a microprocessor 112, a read only memory (ROM) 112M, a control logic 114, a buffer memory 116, and an interface logic 118. The ROM 112M is arranged to store a program code 112C, and the microprocessor 112 is arranged to execute the program code 112C to control access to the flash memory 120.

Typically, the flash memory 120 comprises a plurality of blocks, and the controller (e.g. the memory controller 110 that executes the program code 112C by utilizing the microprocessor 112) performs data copying, erasure and combining operations on the flash memory 120 by copying, erasing and combining in units of blocks. In addition, a block can be utilized for recording a specific amount of pages, where the controller (e.g. the memory controller 110 that executes the program code 112C by utilizing the microprocessor 112) performs data writing operations on the Flash memory 120 by writing/programming in units of pages.

In practice, the memory controller 110 that executes the program code 112C by utilizing the microprocessor 112 is capable of performing various control operations by utilizing the internal components within the memory controller 110. For example, the memory controller 110 utilizes the control logic 114 to control access to the flash memory 120 (e.g. operations of accessing at least one block or at least one page), utilizes the buffer memory 116 to perform buffering operations for the memory controller 110, and utilizes the interface logic 118 to communicate with a host device.

Figure 2:
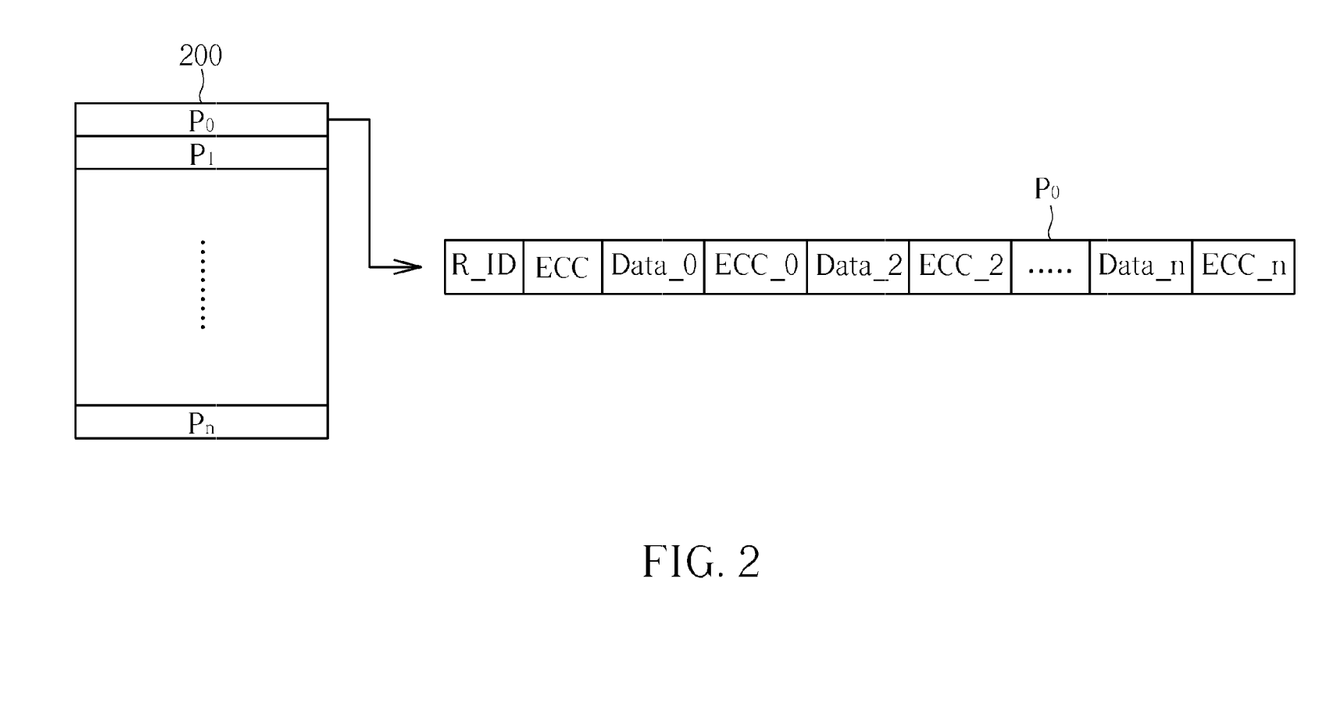
FIG. 2 is a diagram illustrating a block of the flash memory shown in FIG. 1 according to a first embodiment of the present invention.
Figure 3:
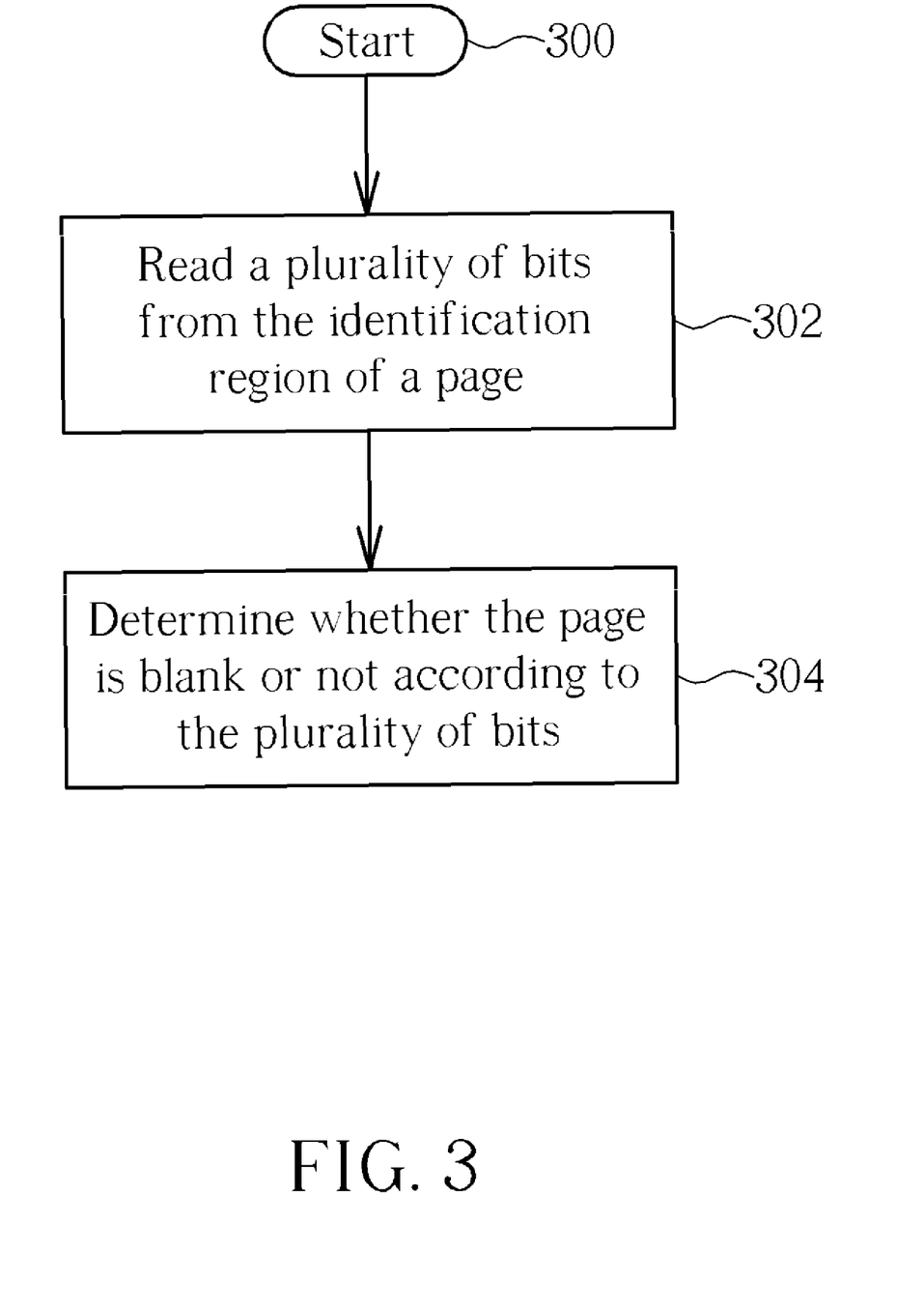
FIG. 3 is a flowchart of the memory controller identifying the pages of the block of the flash memory and determining whether the pages are blank or not

Please refer to FIG. 1, FIG. 2 and FIG. 3 together. FIG. 2 is a diagram illustrating a block 200 of the flash memory 120 shown in FIG. 1 according to a first embodiment of the present invention. The block 200 includes a plurality of pages $P_0, P_1, \ldots, P_n$, where each of the pages $P_0, P_1, \ldots, P_n$ includes an identification region R_ID, a plurality of data regions Data_0, Data_1, ..., Data_n, and error correction codes ECC, ECC_0, ECC_1, ..., ECC_n which respectively correspond to the identification region R_ID and the data regions Data_0, Data_1, ..., Data_n. FIG. 3 is a flowchart of the memory controller 110 identifying the pages of the block 200 of the flash memory 120 and determining whether the pages are blank or not. Taking the page $P_0$ as an example, the flow is described as follows:

When the memory controller 110 performs a writing/programming operation on the flash memory 120, the pages are written by referring to the format shown in FIG. 2. Taking the page $P_0$ as an example, first, the memory controller 110 writes an identification data to a beginning position of the page $P_0$; that is, the identification data is written into the identification region R_ID of the page $P_0$. In the following operations of the memory device 100, the data is to be stored in the data region Data_0, Data_1, ..., Data_n which are positioned after the identification region R_ID. In addition, when the memory controller has not performed a writing operation on the page $P_0$, or all the data stored in the page $P_0$ is erased (i.e., the page is blank), a predetermined value, such as "0xff", is stored in the identification region R_ID of the page $P_0$.

Figure 4:
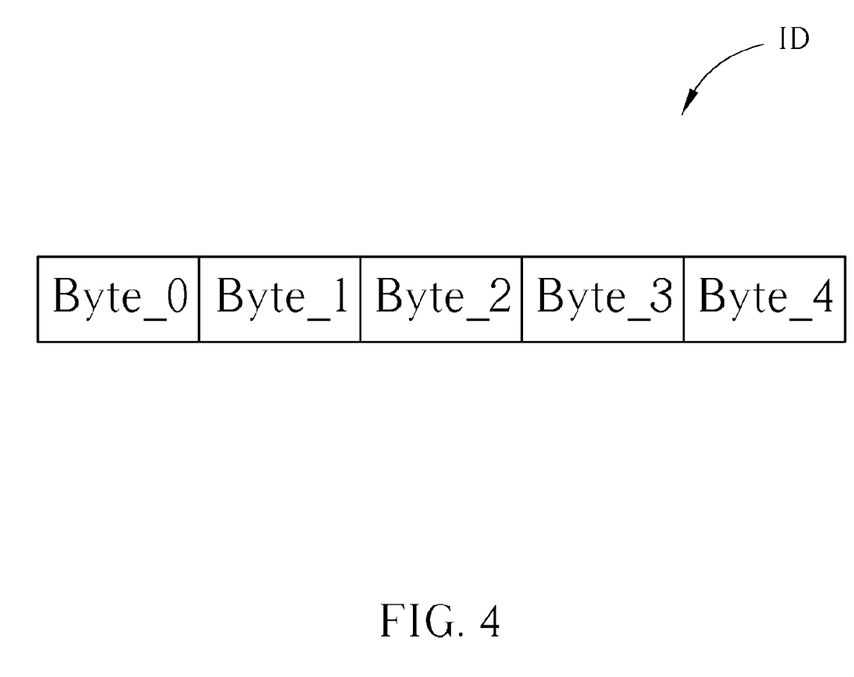
FIG. 4 is a diagram illustrating an identification region described in FIG. 3.

In Step 300, the flow starts. In Step 302, the memory controller 100 reads a plurality of bits from the identification region R_ID of the page $P_0$. Then, in Step 304, the memory controller 110 determines whether the page $P_0$ is blank or not according to the plurality of bits read from the identification region R_ID. In particular, in Steps 302 and 304, the memory controller 110 reads a specific byte from the identification region R_ID, and determines whether the page $P_0$ is blank or not according to the specific byte. For example, the identification region R_ID generally includes a plurality of bytes Byte_0, ..., Byte_4 shown in FIG. 4. where Byte_0 is an identification byte, Byte_1 and Byte_2 are information of logic block address (LBA), Byte_3 is information of page pointer, and Byte_4 is a spare byte. If the identification byte Byte_0 is the predetermined value which represents the page is blank (e.g., "0xff"), the page $P_0$ can be determined as a blank page; if the identification byte Byte_0 is another value, the page $P_0$ can be determined as a non-blank page. Therefore, by reading and identifying the identification byte Byte_0 from the identification region R_ID, the memory controller 110 can exactly determine whether the page $P_0$ is blank or not. After the memory controller 110 reads and identifies the identification byte Byte_0 from the identification region R_ID; when the page $P_0$ is determined as a blank page, the memory controller 110 does not read the remaining data of the page $P_0$; and when the page $P_0$ is determined as a non-blank page, the memory controller 110 continues to read the remaining data of the page $P_0$.

It is noted that, in the aforementioned embodiments, the memory controller 110 determines whether the page $P_0$ is blank or not by reading the identification byte Byte_0 from the identification region R_ID. In another embodiment of the present invention, however, the identification region R_ID includes an identification bit, and the memory controller 110 determines whether the page $P_0$ is blank or not by reading the identification bit. This alternative design also falls within the scope of the present invention.

Referring to the method of identifying the page $P_0$ of the block 200 of the flash memory 120 described above, because the identification region R_ID is positioned at the beginning of the page $P_0$, the memory controller 110 only needs to read one byte or a few bytes, and this byte(s) is sufficient for the memory controller 110 to determine whether the page $P_0$ is blank or not. Compared with the prior art page-identifying method which needs to read all the bytes of the page $P_0$, the present invention significantly improves the efficiency of accessing the flash memory 120.

In addition, in the aforementioned embodiments, the identification region R_ID is positioned at the beginning of the page $P_0$. In another embodiment of the present invention, however, the identification region R_ID can be positioned before the data regions Data_0, Data_1, ..., Data_n, and does not need to be positioned at the beginning of the page $P_0$. This alternative design also falls within the scope of the present invention.

Figure 5:
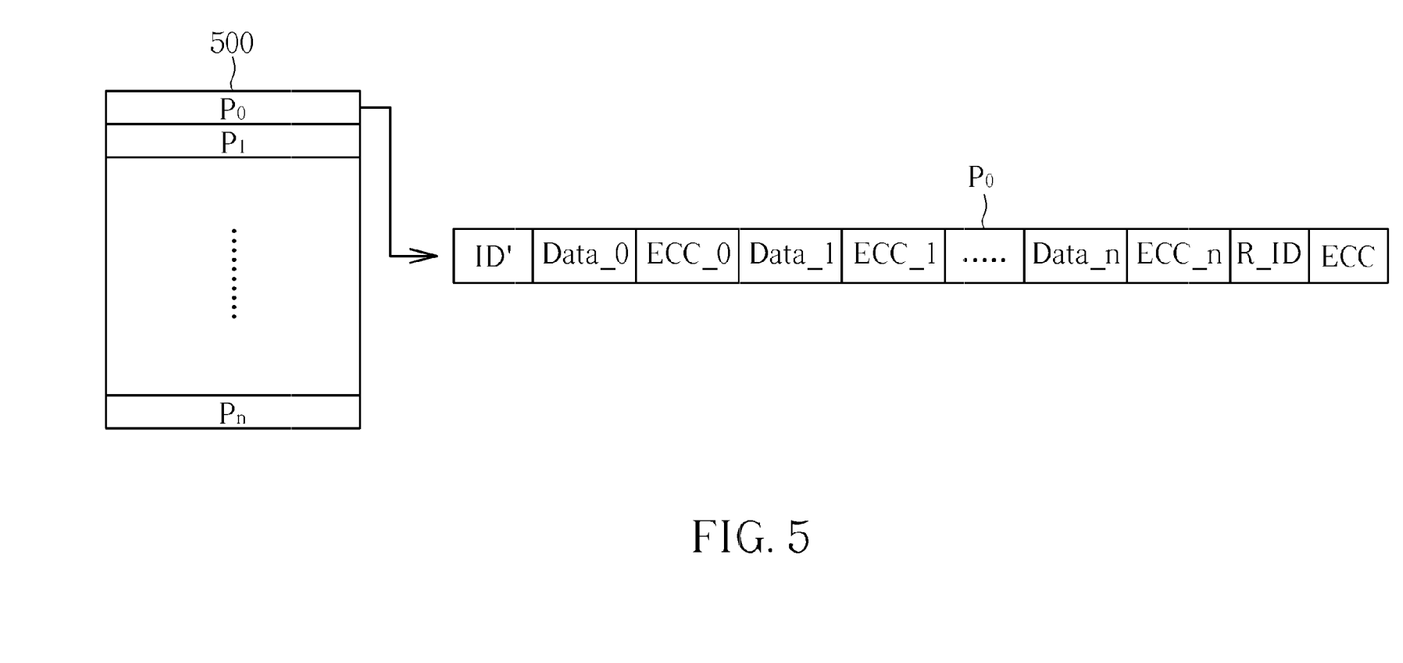
FIG. 5 is a diagram illustrating a block of the flash memory shown in FIG. 1 according to a second embodiment of the present invention.
Figure 6:
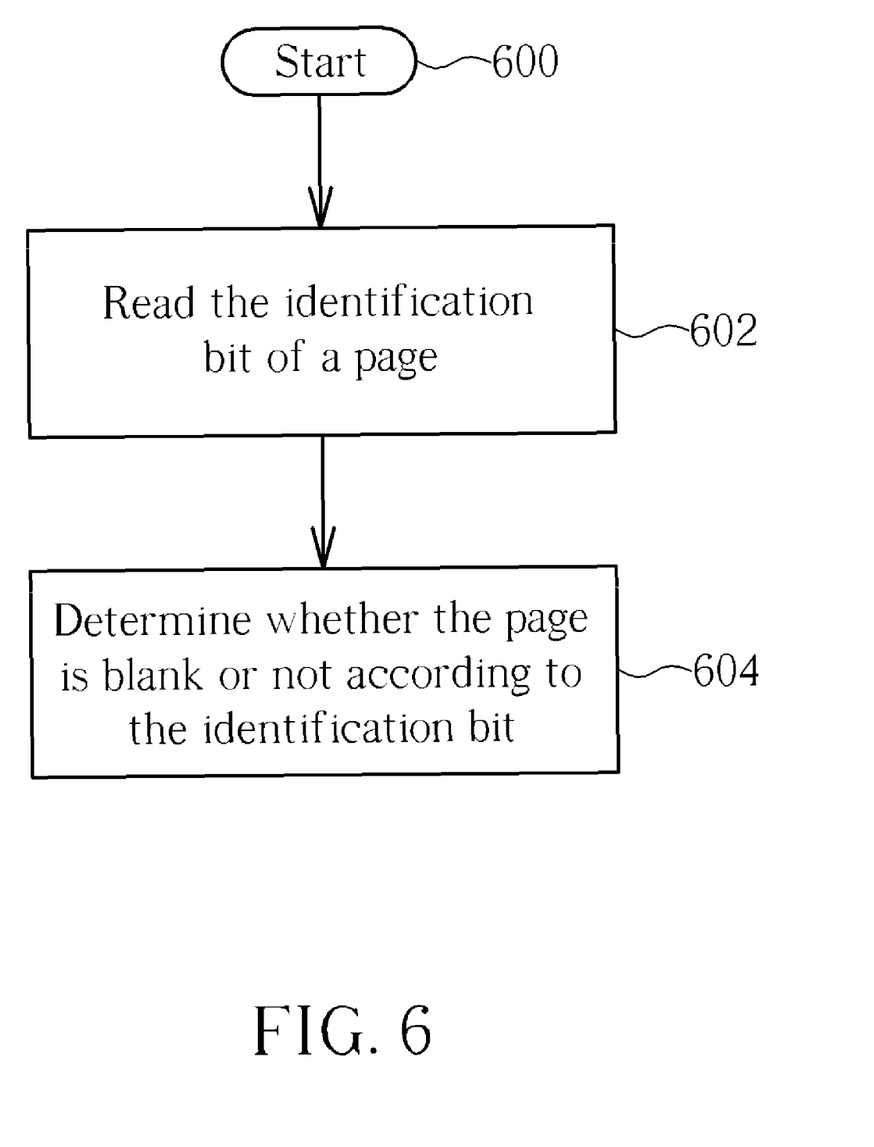
FIG. 6 is a flowchart of the memory controller identifying the pages of the block of the flash memory and determining whether the pages are blank or not.

Please refer to FIG. 1, FIG. 5 and FIG. 6 together. FIG. 5 is a diagram illustrating a block 500 of the flash memory 120 according to a second embodiment of the present invention. The block 500 includes a plurality of pages $P_0, P_1, \ldots, P_n$, where each of the pages $P_0, P_1, \ldots, P_n$ includes an identification bit ID', an identification region R_ID, a plurality of data regions Data_0, Data_1, ..., Data_n, and error correction codes ECC, ECC_0, ECC_1, ..., ECC_n which respectively correspond to the identification region R_ID and the data regions Data_0, Data_1, ..., Data_n. FIG. 6 is a flowchart of the memory controller 110 identifying the pages of the block 200 of the flash memory 120 and determining whether the pages are blank or not. Taking the page $P_0$ shown in FIG. 5 as an example, the flow is described as follows:

Before the memory controller 110 starts to identify the pages of the block 500 of the flash memory 120, and when the memory controller 110 performs a writing/programming operations on the page $P_0$ of the block 500, an identification bit ID' is positioned at a beginning position of the page $P_0$. In the following operations of the memory device 100, the identification bit ID' is used for representing whether the page $P_0$ includes data or not. For example, if the page $P_0$ includes data, the identification bit ID' is set as "0"; if the page $P_0$ does not include data (the page $P_0$ is blank), the identification bit ID' is set as "1". The other pages ($P_1$-$P_n$) is performed the similar operations as the $P_0$ is, and further descriptions are therefore omitted here.

In Step 600, the flow starts. In Step 602, the memory controller 110 reads the identification bit ID' of the page $P_0$. Then, in Step 604, the memory controller 110 determines whether the page $P_0$ is blank or not according to the identification bit ID'.

After the memory controller 110 reads and identifies the identification bit ID', when the page $P_0$ is determined as a blank page, the memory controller 110 does not read the remaining data of the page $P_0$; and when the page $P_0$ is determined as a non-blank page, the memory controller 110 continues to read the remaining data of the page $P_0$. In the method shown in FIG. 6, because the identification bit ID' is positioned at the beginning of the page $P_0$, the memory controller 110 only needs to read one bit, and this bit is sufficient for the memory controller 110 to determine whether the page $P_0$ is blank or not. Compared with the prior art page-identifying method which needs to read all the bytes of the page $P_0$, the present invention significantly improves the efficiency of accessing the flash memory 120.

Figure 7:
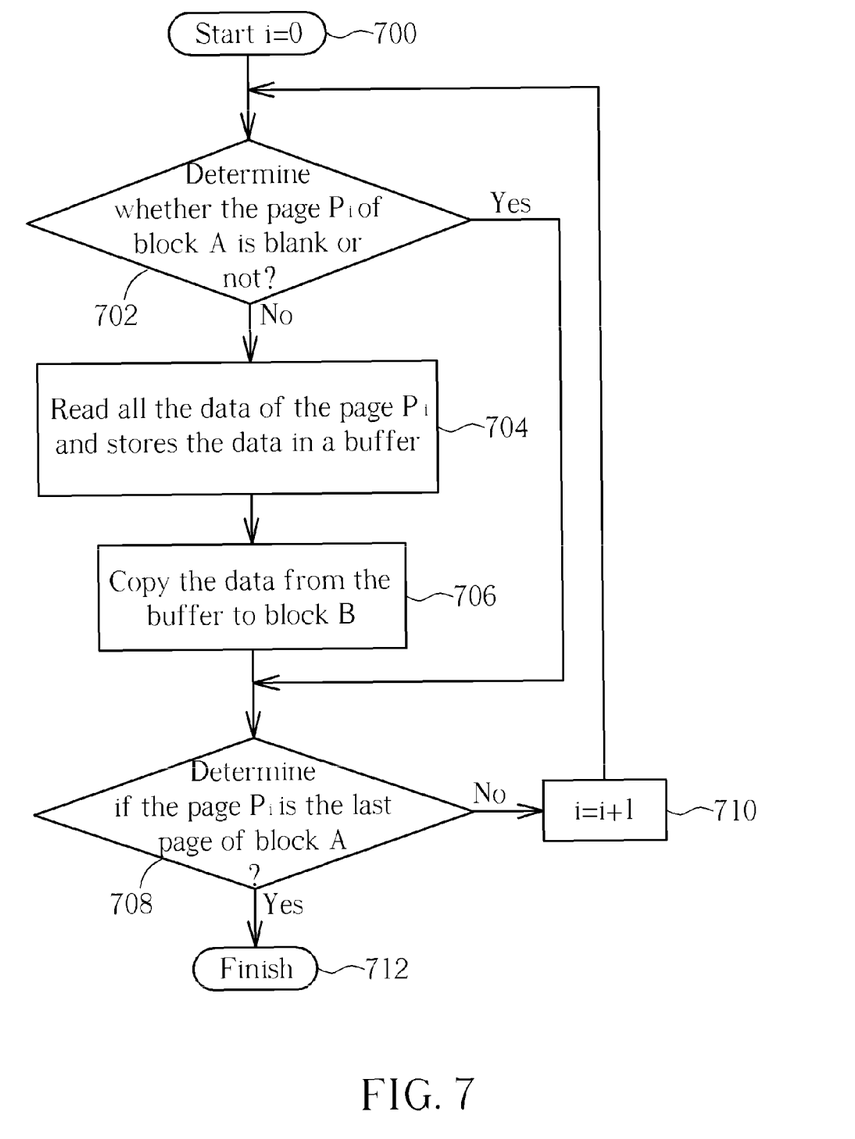
FIG. 7 is a flowchart of the memory controller copying data from a block A to a block B.
Figure 8:
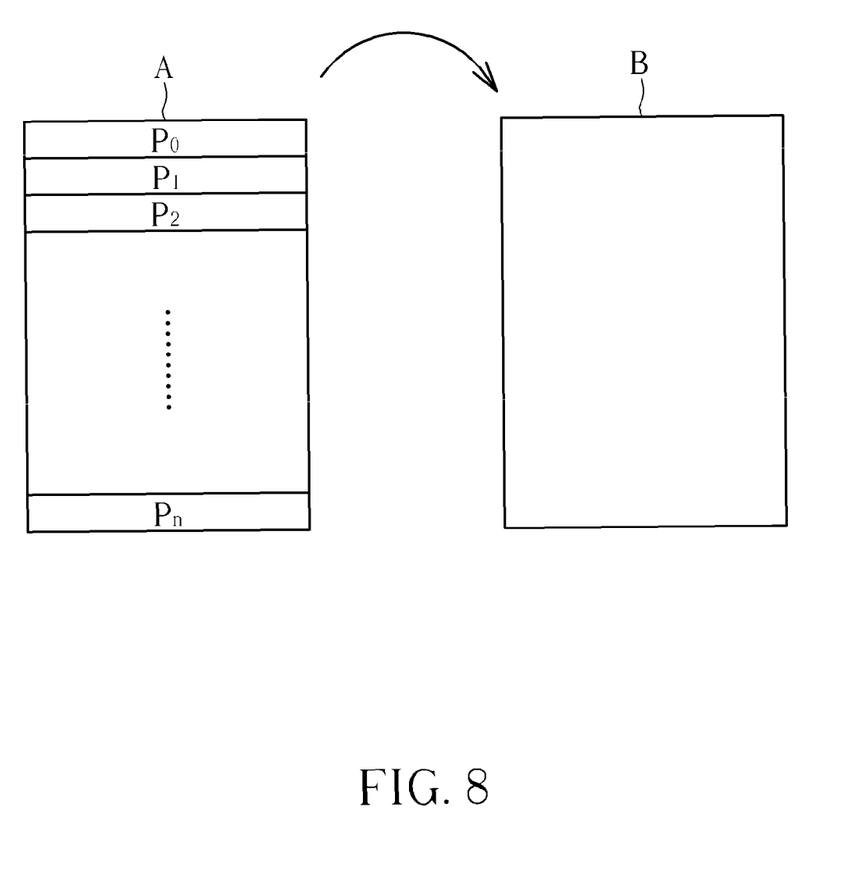
FIG. 8 is a diagram illustrating the data is copied from block A to block B.

Please refer to FIG. 1, FIG. 7 and FIG. 8 together. FIG. 7 is a flowchart of the memory controller 110 copying data from a block A to a block B, and FIG. 8 is a diagram illustrating the data is copied from block A to block B, where block A includes a plurality of pages $P_0, P_1, \ldots, P_n$. Referring to FIG. 7, the flow is as follows:

In Step 700, the flow starts. In Step 702, the memory controller 110 determines whether the page $P_i$ of the block A is blank or not. If the page $P_i$ is blank, the flow enters Step 708; if the page $P_i$ is not blank, the flow enters Step 704. It is noted that, in Step 702, the method shown in FIG. 3 or FIG. 6 can be used to determine whether the page $P_i$ is blank or not. When the memory controller 110 reads the identification byte Byte_0 (embodiment shown in FIG. 3) or the identification bit ID' (embodiment shown in FIG. 6) and determines the page $P_i$ is blank, the memory controller 110 does not read the remaining data of the page $P_i$ and the flow enters Step 708; and when the page $P_i$ is determined as a non-blank page, the flow enters Step 704 and the memory controller 110 continues to read the remaining data of the page $P_i$.

In Step 704, the memory controller 110 reads all the data of the page $P_i$ and stores the data in a buffer (not shown). In Step 706, the memory controller 110 copies the data from the buffer to the block B. Then, in Step 708, the memory controller 110 determines if the page $P_i$ is the last page of block A. If the page $P_i$ is not the last page of block A, the flow enters Step 710 and then returns to Step 702 to determine whether the page $P_{i+1}$ is blank or not; if the page $P_i$ is the last page of block A, the flow enters Step 712 to finish the operation.

Briefly summarized, in the method for identifying a page of a block of a flash memory and determining whether the page is blank or not, and the associated memory device thereof of the present invention, the identification region is positioned at the beginning of the page. Therefore, the controller only needs to read a specific byte from the identification region, and this specific byte is sufficient for the memory controller to determine whether the page is blank or not. Therefore, when the memory device uses the method of the present invention to perform data copy or data merge operations, the accessing time can be reduced and the efficiency of the memory device is greatly improved.

Those skilled in the art will readily observe that numerous modifications and alterations of the device and method may be made while retaining the teachings of the invention.

What is claimed is:

1. A method for identifying a page of a block of a flash memory, comprising:
    reading a specific byte from an identification region of the page;
    determining whether the page is blank or not by referring to the specific byte without referring to any other byte of the page;
    when the page is determined as a blank page, not reading remaining data of the page; and
    when the page is determined as a non-blank page, continuing to read the remaining data of the page.

2. The method of claim 1, wherein the identification region is positioned before all data regions of the page.

3. The method of claim 2, wherein the step of reading the specific byte from the identification region of the page comprises:
    reading the specific byte from the identification region which is positioned at a beginning of the page.

4. The method of claim 1, wherein the step of determining whether the page is blank or not by referring to the specific byte comprises:
    when the specific byte is a predetermined value, determining that the page is a blank page; and
    when the specific byte is not the predetermined value, determining that the page is not a blank page.

5. A memory device, comprising:
    a flash memory, wherein the flash memory comprises a plurality of blocks, and each block comprises a plurality of pages; and
    a controller, for reading a specific byte from an identification region of a page of the plurality of pages, and determining whether the page is blank or not by referring to the specific byte without referring to any other byte of the page,
    wherein when the page is determined as a blank page, the controller does not read remaining data of the page; and when the page is determined as a non-blank page, the controller continues to read the remaining data of the page.

6. The memory device of claim 5, wherein the identification region is positioned before all data regions of the page.

7. The memory device of claim 6, wherein the controller reads the specific byte from the identification region which is positioned at a beginning of the page.

8. The memory device of claim 5, wherein when the specific byte is a predetermined value, the controller determines that the page is a blank page; and when the specific byte is not the predetermined value, the controller determines that the page is not a blank page.

9. A method for identifying a page of a block of a flash memory, comprising:
    reading an identification bit from the page;
    determining whether the page is blank or not by referring to the identification bit without referring to any other bit of the page;
    when the page is determined as a blank page, not reading remaining data of the page; and
    when the page is determined as a non-blank page, continuing to read the remaining data of the page.

10. The method of claim 9, wherein the step of reading the identification bit from the page comprises:
    reading the identification bit which is positioned at a beginning of the page.

11. The method of claim 9, wherein the identification bit is within an identification region of the page, and the identification region is positioned at a beginning of the page.

12. A memory device, comprising:
    a flash memory, wherein the flash memory comprises a plurality of blocks, and each block comprises a plurality of pages; and
    a controller, for reading an identification bit from a page of the plurality of pages, and determining whether the page is blank or not by referring to the identification bit without referring to any other bit of the page,
    wherein when the page is determined as a blank page, the controller does not read remaining data of the page; and when the page is determined as a non-blank page, the controller continues to read the remaining data of the page.

13. The memory device of claim 12, wherein the controller reads the identification bit which is positioned at a beginning of the page.

14. The memory device of claim 12, wherein the identification bit is within an identification region of the page, and the identification region is positioned at a beginning of the page.

15. A method for copying data from a first block to a second block of a flash memory, wherein the first block comprises a plurality of pages, and the method comprises:
    for each page:
        reading an identification bit or an identification byte from the page;

determining whether the page is blank or not by referring to the identification bit or the identification byte without referring to any other data of the page;

when the page is determined as a non-blank page, reading all data of the page, storing the data into a buffer, and copying the data from the buffer to the second block; and when the page is determined as a blank page, not reading remaining data of the page, and immediately starting to read an identification bit or an identification byte from a next page, and to determine whether the next page is blank or not.

* * * * *